July 18, 1967 H. J. LAURENT ET AL 3,331,128

METHOD OF ASSEMBLING A RADIO RECEIVER

Filed July 11, 1962

4 Sheets-Sheet 1

INVENTORS

HAROLD J. LAURENT
FERNAND J. PELLETIER
MICHAEL SLAVIN

July 18, 1967 H. J. LAURENT ETAL 3,331,128

METHOD OF ASSEMBLING A RADIO RECEIVER

Filed July 11, 1962

4 Sheets-Sheet 2

INVENTORS
HAROLD J. LAURENT
FERNAND J. PELLETIER
MICHAEL SLAVIN

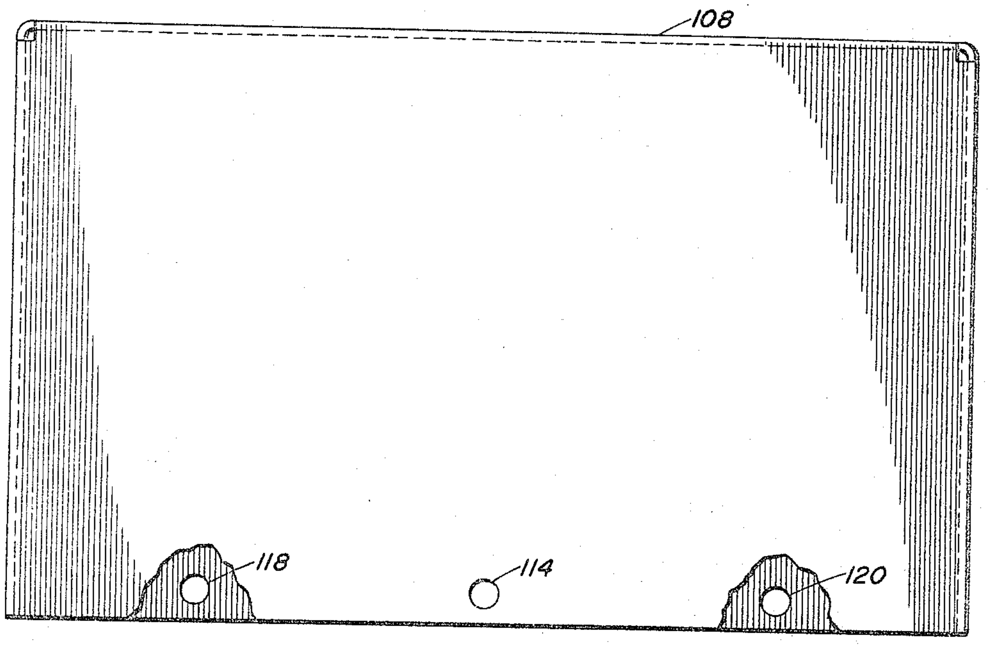
FIG. 6.
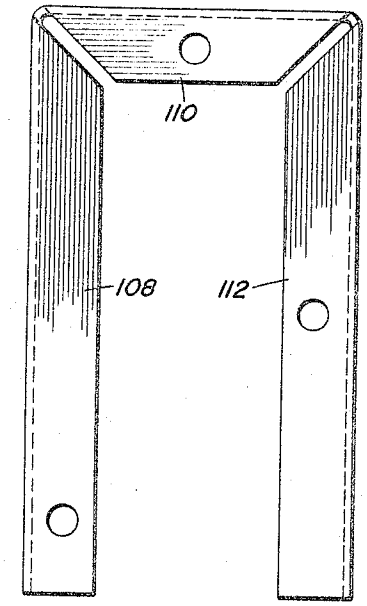
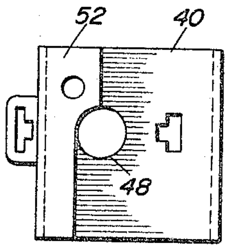
FIG. 4.
HAROLD J. LAURENT
FERNARD J. PELLETIER
MICHAEL SLAVIN
INVENTORS
FIG. 7.

HAROLD J. LAURENT
FERNAND J. PELLETIER
MICHAEL SLAVIN
INVENTORS

United States Patent Office 3,331,128

Patented July 18, 1967

3,331,128

METHOD OF ASSEMBLING A RADIO RECEIVER

Harold J. Laurent, Michael Slavin, and Fernand J. Pelletier, Baltimore, Md., assignors to The Bendix Corporation, Baltimore, Md., a corporation of Delaware Filed July 11, 1962, Ser. No. 209,066
7 Claims. (Cl. 29—626)

ABSTRACT OF THE DISCLOSURE

A method of assembling a radio receiver wherein certain structural members plus various electrical components including tuner, volume control potentiometer, transformers, resistors, capacitors, and inductances are placed on a printed circuit board having perforations defining areas of the board to be broken-away, plus additionally placing jumper wires between those areas and soldering in a single operation all components, wires and structural members so placed on the board. The break-away areas are then separated from the remainder of the printed circuit board and repositioned into a desired ultimate relationship with the other receiver components.

This invention relates to electronic equipment such as radio receivers and more particularly to a mechanical arrangement of components and parts for such equipment permitting unusually economical assembly and to the method of producing such equipment.

In the manufacture of vehicular electronic equipment of very low cost such as automobile receivers there have developed a number of almost universally accepted assembly techniques for dealing with problems which are more or less unique to this field. Because the power supplied to such equipment as well as the antenna input typically carry a substantial undesirable high frequency component due to the ignition system of the associated vehicle, it has become customary for the power line leads, the speaker leads, the antenna socket and trimmer capacitor to be part of the sheet metal assembly serving as part of the cabinet because of the need for good bypassing near the point of entry. Modern assembly techniques usually involve the use of circuit boards to which most of the components are attached, either through automatic or manual means. The entire board with the components attached is then dip soldered to produce a soldered joint at each desired connection. The connections with the components mounted on the chassis have, however, required a separate hand soldering operation which adds significantly to the assembly cost. In addition to the chassis, a sheet metal cover has usually been required to provide proper protection for the radio components, which cover must be removed for servicing. Such covers and chassis are often not so related as to provide proper access to all of the components which might need servicing with removal of only one cover member. It is, therefore, an object of the present invention to provide an assembly for electronic equipment such as automobile radios which may be easily and economically fabricated through the elimination of all hand soldering, while retaining the advantages of chassis grounding of power line wires, antenna sockets and trimmers, speaker leads, and the like.

It is another object of the present invention to provide an assembly as set forth in the above object, in which substantially all of the components and parts are accessible for servicing upon the removal of one cover member and in which removal of said cover member may be effected without disconnecting any electrical wires.

It is another object of the present invention to provide an assembly for vehicular radio receivers which is arranged to permit electrical testing of the entire receiver, except for the power transistor, prior to final assembly at a stage where all components are readily accessible.

It is another object of the present invention to provide an assembly for vehicular radio receivers in which the usual power line clamp is eliminated.

It is a further object of the present invention to provide a method of assembling electronic equipment such as automobile radios in which solder connections to the tuner, power leads, speaker leads and antenna leads, which are normally hand soldered, may be accomplished through a single dip soldering operating at the same time as other components are soldered.

Other objects and advantages will become apparent from the following specification and drawings, in which:

FIG. 4 is a view from the front of the receiver of the volume control mounting bracket shown in FIG. 1;

FIG. 6 is a top view of the cover for the receiver;

FIG. 7 is a side view of the cover shown in FIG. 6; and

Figure 1:
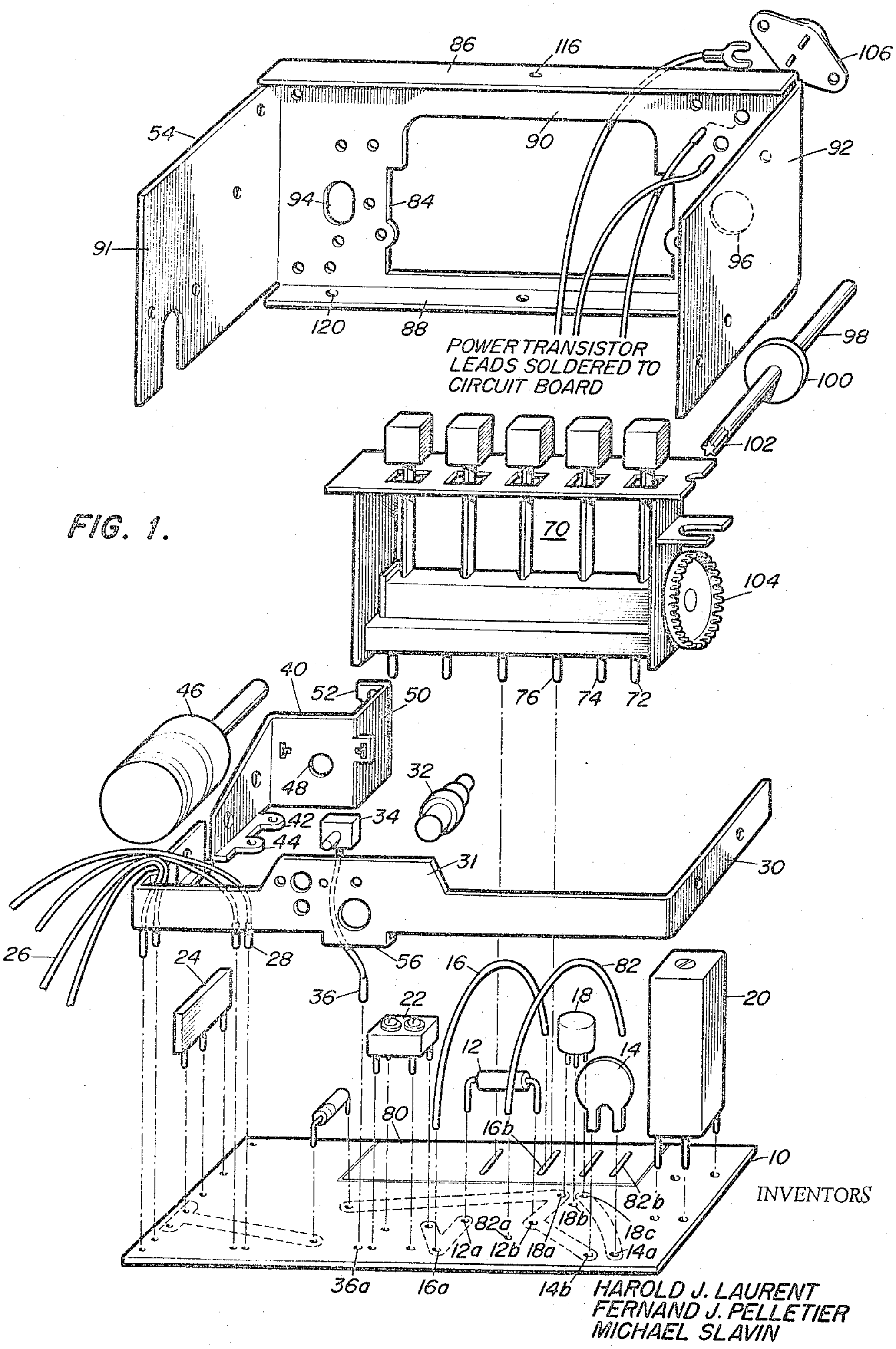
FIG. 1 is an exploded view of a radio receiver embodying our invention showing its manner of assembly and its principal components.

Referring now to FIG. 1, a circuit board of a type well known in the art is shown at numeral 10. This board includes a number of conducting tracks, a few of which are shown on its lower side, which provides communication between terminals to which are connected a number of components and parts. No attempt has been made here to show all the components of an operative radio, but enough components of different types are illustrated to show the manner of assembly. A resistor 12 has axial leads which are connected to terminals **12*a* and 12*b* on the circuit board. Similarly, the disc capacitor 14 is connected into the board at terminals 14*a* and 14*b*; a wire 16 is connected to terminals 16*a* and 16*b*; and a transistor 18 has lead wires connecting with terminals 18*a*, 18*b* and 18*c*. Larger components such as the intermediate frequency transformer 20 and the double section trim capacitor 22 have lead wires or prongs which are plugged into the board as shown. Certain components and wires deserve particular attention such as the capacitor 24 which performs the functions of the conventional "spark plate" and will be referred to as the "spark plate" capacitor, acting as a filtering means for bypassing undesirable high frequency ignition noise and which has leads plugging into terminals along the edge of the board; the power line wires 26 and the speaker leads 28 which are inserted into terminals near the edge of the board. Attached to the circuit board 10 is a sub-support member 30 which includes a rail extending substantially around three sides of the board 10 and a flange 31 which receives an antenna input jack 32 and an antenna trim capacitor 34 which includes a wire 36 connected to the circuit board near its edge at terminal 36*a*. A separate mounting bracket 40 having tabs 42 and 44 for receiving rivets or other fastening means is also attached to the circuit board 10. A volume control potentiometer 46 is mounted through a port 48 of bracket 40. A forward extension 50 of this bracket supports a mounting plate 52 including fastener receiving means to which the chassis 54** is mounted.

Figure 2:
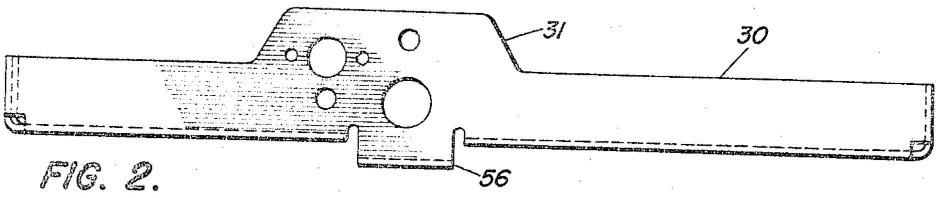
FIG. 2 is a view, directly from the rear of the receiver, of the support member attached to the circuit board.
Figure 3:
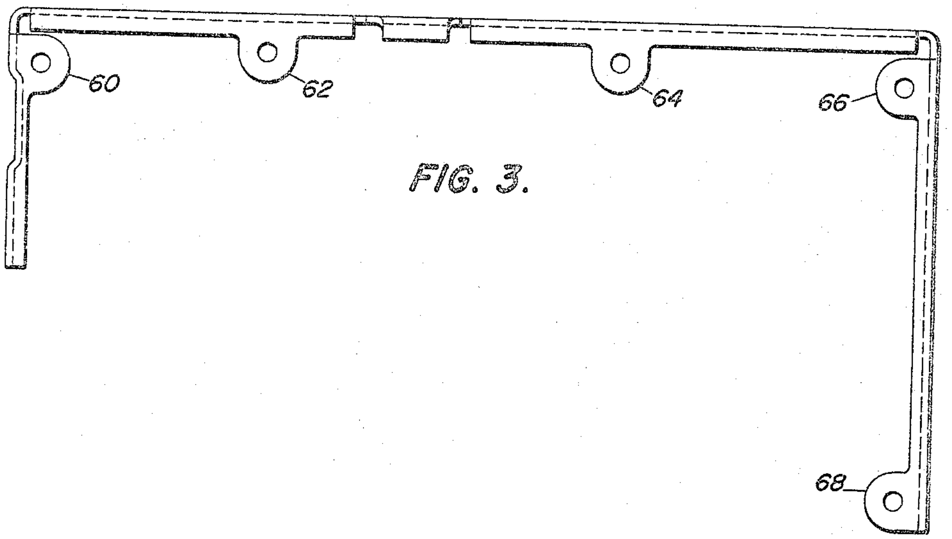
FIG. 3 is a view from the bottom of the sub-support member shown in FIG. 2.

Additional views of the sub-support member 30 are shown in FIGS. 2 and 3. FIG. 2 shows member 30 as viewed directly from the back of the receiver including flange 31 and the holes for receiving the input jack 32 and the adjusting member for the antenna trim capacitor 34. It will be observed that member 30 includes a tab 56 which extends below the remainder of a member and serves as a stop against which the circuit board is abutted at the time member 30 is fastened to the circuit board. On FIG. 3, which is a bottom view of member 30, it will be seen that a plurality of tabs 60, 62, 64, 66 and 68 are included for receiving fastening means to attach member 30 to the circuit board. Visible on FIG. 1 are a plurality of holes in member 30, which may be threaded, for receiving fastening means for attaching the chassis member 54 to the sub-support member 30.

A tuner assembly 70 carries a plurality of connectors 72, 74, 76, etc. which are plugged into a break-away section 80 of the circuit board 10. It will be observed that wire 16 is shown connected to terminal **16*b* on the break-away portion 80 of the circuit board 10. Another wire 82 is plugged into another connector 82*b* on the break-away section of the board as well as a terminal 82*a* on the main part of circuit board 10. When all of these components including resistors, capacitors, wires, the feet or prongs of the volume control member 46, and the connectors of the tuning member 70 have been inserted into the proper connecting terminals of the circuit board 10, and the sub-support member 30 has been properly affixed thereto as well as the bracket 40, the entire assembly is subjected to a dip soldering operation, at which time all of the solder joints of the receiver are simultaneously soldered. At this time the tuning assembly 70 is rotated approximately 90° from its desired position on the circuit board and this tuning assembly and the break-away section 80 of the printed circuit board are then broken away from the remainder of circuit board 10 and rotated to a new position so that the pushbuttons extend toward the front of the receiver and the tuning assembly is then bolted down in its new position on the board 10. The wires 16 and 82, plus any others which may be attached to the tuner 70**, are, of course, made sufficiently long to permit this operation.

Figure 5:
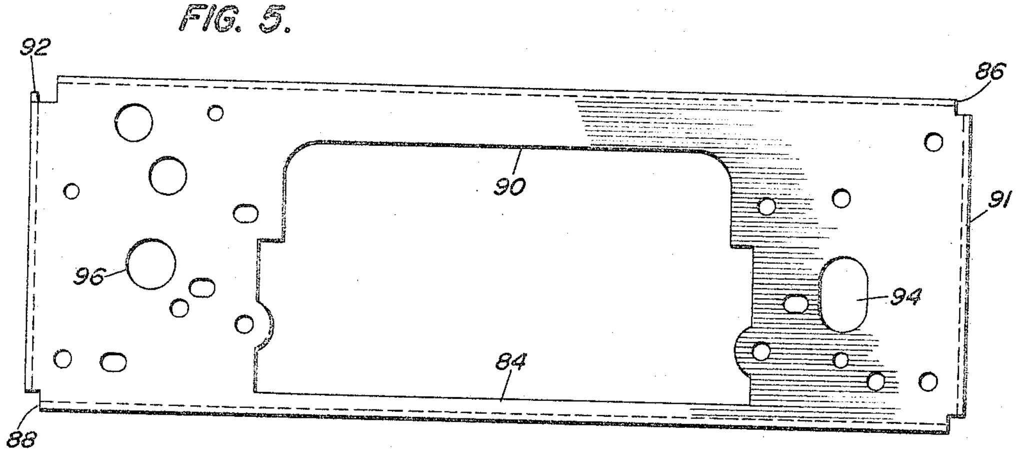
FIG. 5 is a view from the front of the receiver of the chassis shown in FIG. 1.

The chassis member 54 is shown in perspective in the exploded view FIG. 1, and also as viewed directly from the front of the receiver in FIG. 5. Member 54 includes a large opening 84 through which the tuner assembly 70, as finally located, protrudes so that the pushbuttons and the tuning dial will be accessible. This chassis includes top and bottom flanges 86 and 88, both of which contain holes for receiving fastening screws. This chassis member is U shaped, having a front panel 90 and side panels 91 and 92, all of which have holes for receiving mounting screws or other fasteners for fastening the chassis member 84 to the sub-support member 30 and the volume control mounting bracket 40. The large holes in the front panel 90 beside the opening 84 include the port 94 for receiving the volume control shaft and port 96 which receives the manual tuning shaft 98. The manual tuning shaft 98 is supported in port 96 on a journal 100 and includes a section of elongated gear teeth 102 which mesh with the teeth on the edge of a cup-shaped drive wheel 104 connected to the tuning assembly 70 for the purpose of providing manual tuning of the tuner section. Because of its very substantial power dissipation, the output or power transistor 106 cannot be fastened to the circuit board 10, but must be fastened to a member having appreciable mass and heat dissipating ability such as an escutcheon plate (not shown in FIG. 1, see FIG. 8) attached to the front of the chassis member 54. When the chassis 54 is completely fastened to the sub-support member 30 and the volume control bracket 40, the power supply lead-in wires 26 are then effectively clamped between members 30 and 54 and no additional power line claim is required (see FIG. 8). It will be observed that at this stage of assembly, the radio is completely operative and in condition for making any desired electrical testing or effecting any repairs, inasmuch as the working parts are all readily accessible. All that remains is the installation of the cover 108, which is shown in top view in FIG. 6 and in side view in FIG. 7. This cover 108 is also U shaped in such manner as to cover top, bottom, and back of the receiver. In FIG. 7 are shown a plurality of flanges 108, 110 and 112 which overlap the sides of the chassis member 54, thereby permitting screws to be inserted through the member 108 into the member 54. FIG. 6 shows a screw receiving hole 114 which cooperates with a hole 116 in flange 86, and is broken away to show holes 118 and 120 for attaching the cover member 108 to the chassis 54 near the front of the receiver.

Figure 8:
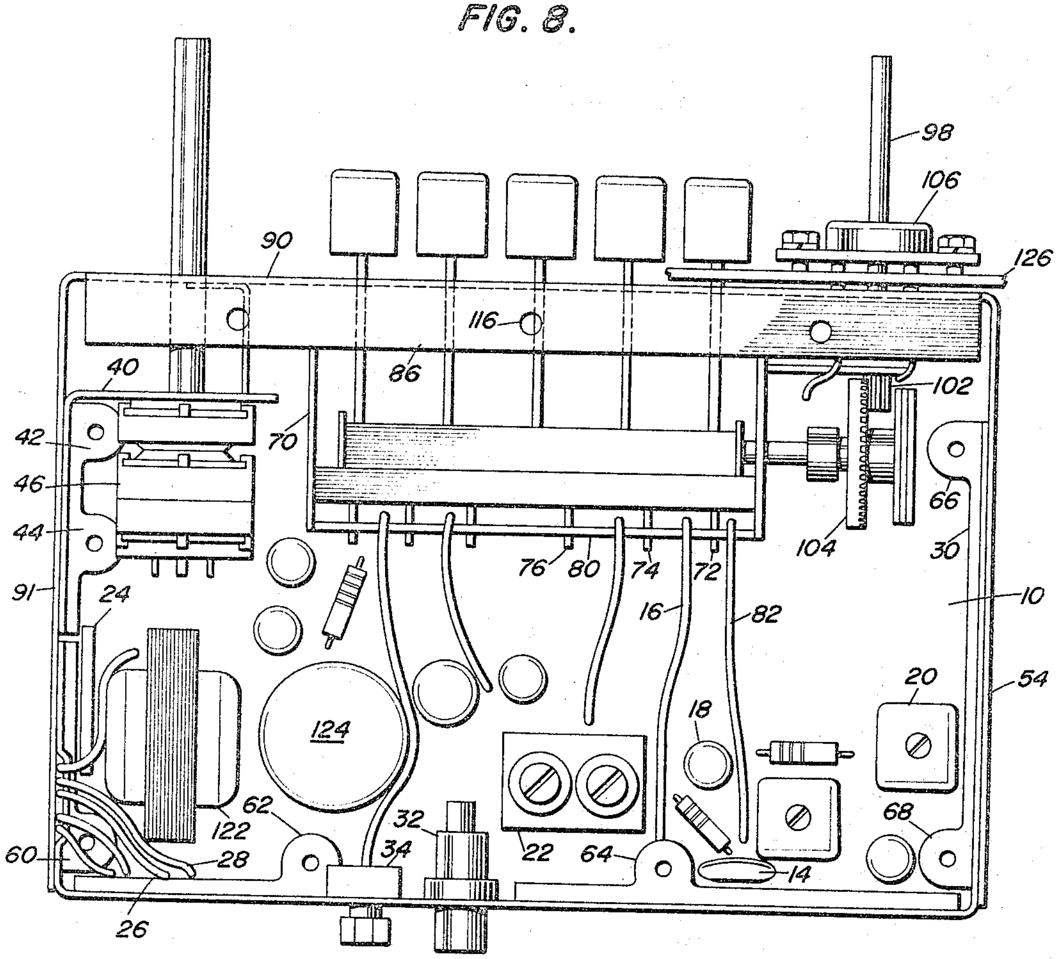
FIG. 8 is a view of the assembled radio receiver as viewed from the top prior to the installation of the cover.

In FIG. 8 is shown the assembled radio receiver prior to the installation of the cover 108. Again it will be noted that to avoid confusing the drawing not all of the parts have been shown, but only certain major parts and exemplary small parts. Two particularly large components, the output transformer 122 and the electrolytic capacitor 124 were not shown in FIG. 1 because of their size which would tend to confuse the showing and would not add materially to an understanding of the invention, inasmuch as they are installed and connected in the same manner as the other major components such as capacitor 22. It will be observed that the tuner is in its desired ultimate position with the break-away section 80 of the circuit board now perpendicular to the remainder of the board 10 at the rear of tuner 70. The wires 16 and 82 which were soldered into both the break-away and stationary portions of the circuit board now extend from the tuner, over the top edge of section 80 to the board 10. Some other components shown in FIG. 1 are present such as the volume control-switch 46 which is supported by bracket 40, the spark plate capacitor 24 which must be soldered at the edge of the sub-support member 30 in order to provide the desired chassis ground, and the speaker wires 28 and the power line wires 26 which are clamped between the sub-support member 30 and the chassis member 54. In this view, the tuning shaft is shown extending through the front of the chassis member 54 with its gear section 102 in mesh with the gear wheel 104 of the tuner 70. Numerous other parts are shown installed such as the antenna socket 32, antenna trimmer 34, disc capacitor 14, trim capacitor 22, intermediate frequency transformer 20, and the transistor 18. The power transistor 106 is shown bolted to the chassis 54 through a fragmentary portion of an escutcheon plate 126 which may assume any of a number of configurations depending on esthetic considerations.

From the foregoing it is apparent that we have provided an electronic assembly suitable for vehicular radio receivers and the like, and a method of manufacturing such assemblies which is easily accessible for servicing by the simple removal of the cover, and in which all hand soldered connections are eliminated, while still retaining the necessary functions and advantages of effective chassis grounds at the points of entry of the power line and the antenna signal. While our invention has been shown in connection with a simple amplitude modulated automobile radio reciver, it will be apparent to those skilled in the art that the advantages taught herein will be applicable to any electronic assembly where the problems of dealing with severe interference, such as engine ignition noise coming in both on the antenna and the power line, must be dealt with within the framework of absolute minimum cost of the assembly operation. Many modifications will be apparent to those skilled in the art which may be made without departing from the inventive concepts shown and described herein.

We claim:

1. A method of assembling an article of electronic equipment including the steps of:

making a circuit board including electrical connections, passageways through said board at said connections, conductive tracks between said connections, and perforations defining the area of a break-away section;

attaching a plurality of components through said passageways including at least one wire extending from said break-away section to another connection on said board;

forming a sub-support including a rail adapted to substantially encompass and support the edges of said circuit board;

fastening said sub-support member to said circuit board;

attaching a sub-assembly structure to said break-away section by inserting connectors thereon through passageways in said section;

subjecting one side of said sub-support member and circuit board assembly to dip soldering so that all of said wires, components, and sub-assembly structure are soldered to desired connections on said circuit board; and separating said break-away section from the remainder of said circuit board and repositioning said sub-assembly structure in its desired ultimate position relative to said circuit board and fastening said sub-assembly structure to said circuit board.

2. A method of assembling an automobile radio including the steps of:

making a printed circuit board including connections, conducting tracks between said connections, passageways through said connections and perforations defining the area of a break-away section;

attaching components to said circuit board by inserting the leads thereof through said passageways including speaker and power line wires and at least one wire extending from said break-away section to another connection on said board;

forming a metal sub-assembly including a rail adapted to substantially encompass and support the edges of said printed circuit board and including fastener receiving means for attaching said assembly to said circuit board and a flange for receiving an antenna socket and trimming capacitor;

fastening said antenna socket and said trimming capacitor to said sub-assembly;

attaching said sub-assembly to said printed circuit board including inserting ungrounded leads from said antenna socket and trimmer through passageways in said board;

attaching a tuning assembly to said break-away section by inserting components thereof through passageways in said section such that said tuning assembly stands perpendicular with respect to said printed circuit board;

conductively bonding the leads of said components and tuning assembly to the desired connections on said circuit board;

separating said break-away section from the remainder of said circuit board and rotating said tuner assembly and break-away section such that said tuning assembly is in its desired ultimate position relative to said circuit board fastening said tuner assembly to said circuit board;

forming a substantially U shaped metal chassis including a face plate having openings for receiving the face of said tuner and the shafts of the volume control and manual tuning control;

fastening said chassis to said sub-assembly whereby certain of said wires are pressed between said chassis and sub-assembly to prevent the solder connections between said wires and said circuit board from receiving severe forces during the course of manipulation of said wires;

forming a substantially U shaped cover adapted to enclose the areas of said radio not enclosed by said chassis;

and attaching said cover to said chassis.

3. A method of assembling an automobile radio including the steps of:

making a printed circuit board including connections, conducting tracks between said connections, passageways through said connections and perforations defining the area of a break-away section;

attaching components to said circuit board by inserting the leads thereof through said passageways including speaker and power line wires and at least one wire extending from said break-away section to another connection on said board;

forming a metal sub-assembly including a rail adapted to substantially encompass and support the edges of said printed circuit board and including fastener receiving means for attaching said assembly to said circuit board and a flange for receiving an antenna socket and trimming capacitor;

fastening said antenna socket and said trimming capacitor to said sub-assembly;

attaching said sub-assembly to said printed circuit board including inserting ungrounded leads from said antenna socket and trimmer through passageways in said board;

attaching a tuning assembly to said break-away section by inserting components thereof through passageways in said section such that said tuning assembly stands perpendicular with respect to said printed circuit board;

subjecting one side of the sub-assembly and circuit board to dip soldering so that all of said components and tuning assembly are soldered to the desired connections on said circuit board;

separating said break-away section from the remainder of said circuit board and rotating said tuner assembly and break-away section such that said tuning assembly is in its desired ultimate position relative to said circuit board, and fastening said tuner assembly to said circuit board.

4. A method of making a radio including the steps of:

making a circuit board including electrical connections and passageways through said board of said connections, conductive tracks between said connections, and perforations defining the area of a break-away section;

attaching a plurality of wires and components having axial leads extending through said passageways, including at least one wire extending from said break-away section to another connection on said board;

forming a sub-assembly including a rail adapted to substantially encompass and support the edges of said circuit board and including a flange for receiving an antenna socket and trimming capacitor;

fastening said antenna socket and said trimming capacitor to said sub-assembly;

fastening said sub-assembly to said circuit board, including inserting ungrounded leads from said antenna socket and trimmer through passageways in said board;

attaching a tuning assembly to the break-away section by inserting connectors on the back thereof through passageways in said section, and attaching other components to said circuit board;

subjecting one side of the sub-assembly and circuit board to dip soldering so that all of said wires, components and tuning assembly are soldered to the desired connections on said circuit board;

separating said break-away section from the remainder of said circuit board and rotating said tuner assembly and break-away section such that said tuning assembly is in its desired ultimate position relative to said circuit board, and fastening said tuner assembly to said circuit board;

forming a substantially U shaped metal chassis including a face plate having openings for receiving the face of said tuner and the shafts of the volume control and manual tuning control;

fastening said chassis to said sub-assembly whereby certain of said wires are pressed between said chassis and sub-assembly to prevent the solder connections between said wires and said circuit board from receiving severe forces during the course of manipulation of said wires;

forming a substantially U shaped cover adapted to enclose the areas of said radio not enclosed by said chassis;

and attaching said cover to said chassis.

5. A method of making a radio including the steps of:

making a circuit board including electrical connections and passageways through said board at said connections, conductive tracks between said connections, and perforations defining the area of a break-away section;

attaching a plurality of wires and components having axial leads extending through said passageways, including at least one wire extending from said break-away section to another connection on said board;

forming a sub-assembly including a rail adapted to substantially encompass and support the edges of said circuit board and including a flange for receiving an antenna socket and trimming capacitor;

fastening said antenna socket and said trimming capacitor to said sub-assembly;

fastening said sub-assembly to said circuit board, including inserting ungrounded leads from said antenna socket and trimmer through passageways in said board;

attaching a tuning assembly to the break-away section by inserting connectors on the back thereof through passageways in said section, and attaching other components to said circuit board;

subjecting one side of the sub-assembly and circuit board to dip soldering so that all of said wires, components and tuning assembly are soldered to the desired connections on said circuit board;

separating said break-away section from the remainder of said circuit board and rotating said tuner assembly and break-away section such that said tuning assembly is in its desired ultimate position relative to said circuit board;

and fastening said tuner assembly to said circuit board.

6. A method of assembling a radio including the steps of:

making a circuit board including electrical connections, passageways through said board at said connections, conductive tracks between said connections, and perforations defining the area of a break-away section;

attaching a plurality of components through said passageways including at least one wire extending from said break-away section to another connection on said board;

forming a sub-support member including a rail adapted to substantially encompass and support the edges of said circuit board and including a flange for receiving an antenna socket;

fastening said antenna socket to said sub-support member and fastening said sub-support member to said circuit board, including inserting ungrounded leads from said antenna socket through passageways in said board;

attaching a tuning assembly to said break-away section by inserting connectors thereon through passageways in said section;

subjecting one side of said sub-support member and circuit board assembly to dip soldering so that all of said wires, components and tuning assembly are soldered to the desired connections on said circuit board;

separating said break-away section from the remainder of said circuit board at said perforations and repositioning said tuner assembly and break-away section such that the tuning assembly is in its desired ultimate position relative to said circuit board and fastening said tuner assembly to said circuit board;

forming a substantially U shaped metal chassis including a face plate having openings for receiving said tuner and a control shaft;

fastening said chassis to said sub-support member such that the power supply wires for said radio are firmly held between said chassis and sub-support member;

forming a substantially U shaped cover adapted to enclose the areas of said radio not enclosed by said chassis and including flanges adapted to receive fastening means for fastening said cover to said chassis;

and attaching said cover to said chassis.

7. A method of assembling a radio including the steps of:

making a circuit board including electrical connections, passageways through said board at said connections, conductive tracks between said connections, and perforations defining the area of a break-away section;

attaching a plurality of components through said passageways including at least one wire extending from said break-away section to another connection on said board;

forming a sub-support member including a rail adapted to substantially encompass and support the edges of said circuit board and including a flange for receiving an antenna socket;

fastening said antenna socket to said sub-support member and fastening said sub-support member to said circuit board, including inserting ungrounded leads from said antenna socket through passageways in said board;

attaching a tuning assembly to said break-away section by inserting connectors thereon through passageways in said section;

subjecting one side of said sub-support member and circuit board assembly to dip soldering so that all of said wires, components and tuning assembly are soldered to the desired connections on said circuit board;

separating said break-away section from the remainder of said circuit board at said perforations and repositioning said tuner assembly is in its desired ultimate position relative to said circuit board and fastening said tuner assembly to said circuit board.

References Cited

UNITED STATES PATENTS

| | | | |
|---|---|---|---|
| 2,168,984 | 8/1939 | Grimes | 317—101 |
| 2,703,377 | 3/1955 | Hings et al. | 317—101 |
| 2,740,097 | 3/1956 | Edelman | 317—101 |
| 2,997,521 | 8/1961 | Dahlgren | 29—155.5 |
| 3,015,726 | 1/1962 | DeMetrick | 325—313 |

JOHN F. CAMPBELL, *Primary Examiner.*

JOHN F. BURNS, *Examiner.*

R. L. GABLE, R. F. DROPKIN, *Assistant Examiners.*